(12) United States Patent
Hoshino et al.

(10) Patent No.: US 12,224,207 B2
(45) Date of Patent: Feb. 11, 2025

(54) METHOD OF PROCESSING A WORKPIECE AND SYSTEM FOR PROCESSING A WORKPIECE

(71) Applicant: DISCO Corporation, Tokyo (JP)

(72) Inventors: Hitoshi Hoshino, Munich (DE); Tzanimir Arguirov, Munich (DE); Yasuyoshi Yubira, Munich (DE); Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/885,526

(22) Filed: May 28, 2020

(65) Prior Publication Data

US 2020/0381303 A1   Dec. 3, 2020

(30) Foreign Application Priority Data

May 31, 2019   (DE) ...................... 10 2019 207 990.3

(51) Int. Cl.
*H01L 21/78* (2006.01)
*H01L 21/268* (2006.01)
(Continued)

(52) U.S. Cl.
CPC ............ *H01L 21/78* (2013.01); *H01L 21/268* (2013.01); *H01L 21/6836* (2013.01);
(Continued)

(58) Field of Classification Search
CPC .............. B28D 5/0082; B32B 38/0004; B32B 38/0012; H01L 21/67132; H01L 21/78
See application file for complete search history.

(56) References Cited

U.S. PATENT DOCUMENTS

2005/0011441 A1   1/2005   Kannan
2005/0173387 A1*  8/2005   Fukuyo ................ B28D 5/0011
219/121.67
(Continued)

FOREIGN PATENT DOCUMENTS

JP           05185270 A    7/1993
JP           11003009 A    1/1999
(Continued)

OTHER PUBLICATIONS

JP_2008270516_A_(machine translation) (Year: 2008).*

*Primary Examiner* — Brian Turner
(74) *Attorney, Agent, or Firm* — GREER BURNS & CRAIN, LTD.

(57) ABSTRACT

The invention relates to a method of processing a workpiece having a first surface, a second surface opposite the first surface, and a third surface extending between the first and second surfaces. The method comprises forming modified regions inside the workpiece so as to create openings in the workpiece. The openings extend to at least one of the first surface, the second surface and the third surface. The method further comprises, after forming the modified regions inside the workpiece, introducing a liquid medium into at least some of the openings and, after introducing the liquid medium into the at least some of the openings, applying an external stimulus to the liquid medium so as to increase the volume of the medium. Moreover, the invention relates to a workpiece processing system for performing this method.

19 Claims, 6 Drawing Sheets

(51) Int. Cl.
*H01L 21/683* (2006.01)
*H01L 23/544* (2006.01)

(52) U.S. Cl.
CPC .. *H01L 23/544* (2013.01); *H01L 2221/68327* (2013.01); *H01L 2223/5446* (2013.01)

(56) References Cited

U.S. PATENT DOCUMENTS

| | | | | |
|---|---|---|---|---|
| 2005/0196899 | A1* | 9/2005 | Shimizu | H01L 21/78 438/113 |
| 2006/0266195 | A1* | 11/2006 | Hoetzel | C03B 33/09 83/880 |
| 2007/0293020 | A1* | 12/2007 | Pressel | B23K 26/40 257/E21.599 |
| 2009/0298263 | A1* | 12/2009 | Watanabe | B23K 26/53 257/E21.237 |
| 2011/0048611 | A1* | 3/2011 | Carre | H01L 21/6835 156/73.1 |
| 2011/0138857 | A1 | 6/2011 | Numata et al. | |
| 2013/0023076 | A1* | 1/2013 | Uchiyama | H01L 33/0095 257/E33.072 |
| 2014/0087541 | A1 | 3/2014 | Werner et al. | |
| 2014/0245608 | A1* | 9/2014 | Morimoto | B23K 26/1224 29/890.1 |
| 2014/0256160 | A1* | 9/2014 | Wada | H01L 21/02238 438/786 |
| 2015/0140835 | A1* | 5/2015 | Tateno | C23C 16/52 438/773 |
| 2015/0221816 | A1* | 8/2015 | Tajikara | H01L 33/0066 438/33 |
| 2016/0228983 | A1* | 8/2016 | Hirata | B23K 26/08 |
| 2016/0336233 | A1* | 11/2016 | Yonehara | B23K 26/082 |
| 2017/0106606 | A1 | 4/2017 | Toyozumi et al. | |
| 2017/0140928 | A1* | 5/2017 | Iwamoto | H01L 21/6715 |
| 2017/0207181 | A1 | 7/2017 | Nakamura | |
| 2018/0015569 | A1* | 1/2018 | Lin | B23K 26/0622 |
| 2018/0040513 | A1 | 2/2018 | Mihai | |
| 2018/0212100 | A1* | 7/2018 | Inoue | H01L 21/78 |
| 2019/0088548 | A1* | 3/2019 | Shiomi | H01L 21/67103 |
| 2019/0148164 | A1* | 5/2019 | Hirata | B23K 26/048 294/213 |
| 2020/0066542 | A1* | 2/2020 | Drescher | H01L 21/324 |
| 2020/0098637 | A1* | 3/2020 | Choi | H01L 21/822 |
| 2020/0388538 | A1* | 12/2020 | Swoboda | B23K 26/0624 |
| 2021/0060693 | A1* | 3/2021 | Sakamoto | H01L 21/78 |

FOREIGN PATENT DOCUMENTS

| | | |
|---|---|---|
| JP | 2003230978 A | 8/2003 |
| JP | 2006156472 A | 6/2006 |
| JP | 2008270516 A | 11/2008 |
| JP | 2009130128 A | 6/2009 |
| JP | 2015035453 A | 2/2015 |
| JP | 2019016651 A | 1/2019 |
| JP | 2019024038 A | 2/2019 |
| KR | 1020160045065 A | 4/2016 |
| WO | 2015010862 A2 | 1/2015 |

* cited by examiner

METHOD OF PROCESSING A WORKPIECE AND SYSTEM FOR PROCESSING A WORKPIECE

TECHNICAL FIELD

The present invention relates to a method of processing a workpiece, such as a wafer, a substrate or an ingot, having a first surface, a second surface opposite the first surface, and a third surface extending between the first and second surfaces. Further, the present invention relates to a system for performing this method.

TECHNICAL BACKGROUND

On substrates, such as wafers, e.g., semiconductor wafers, devices, such as integrated circuits (ICs), large scale integrations (LSIs) and light emitting diodes (LEDs), are formed by providing a device layer on a front surface of the substrate. The substrate may be a wafer, for example, made of silicon carbide (SiC), gallium nitride (GaN), gallium arsenide (GaAs), silicon (Si) or the like. The devices may be, e.g., semiconductor devices, optical devices or electrical components.

For example, in an optical device fabrication process, an optical device layer, e.g., composed of an n-type nitride semiconductor layer and a p-type nitride semiconductor layer, is formed on the front surface of a single crystal substrate, such as a silicon carbide substrate, a gallium nitride substrate or a sapphire substrate. The optical device layer is partitioned by crossing division lines (also referred to as "streets") to define separate regions where optical devices, such as light emitting diodes and laser diodes, are respectively formed. By providing the optical device layer on the front side of the single crystal substrate, an optical device wafer is formed. The optical device wafer is separated e.g., cut, along the division lines to divide the separate regions where the optical devices are formed, thereby obtaining the individual optical devices as chips or dies.

Conventionally, such optical device wafers or other types of wafers are divided into individual chips or dies, for example, by mechanical blade dicing, ablation laser dicing, stealth laser dicing or plasma dicing.

Stealth laser dicing, i.e., forming modified regions within the wafer by the application of a laser beam, allows for the division line widths to be reduced, so that the number of chips or dies which can be obtained from the wafer is increased. However, in known methods, there is a problem that some of the chips or dies may at least not be fully separated from each other in the dicing process. This issue is particularly pronounced for the case of chips or dies with small sizes. If an additional breaking tool is used to ensure complete chip or die separation, the wafer is subjected to increased mechanical stress, resulting in possible damage to the chips or dies.

The substrate, such as a wafer, on which the device layer is to be formed is commonly obtained by cutting a workpiece, such as an ingot. When cutting the workpiece, problems similar to those identified above for the case of cutting a substrate, such as a wafer, may occur. In particular, there is a risk that the substrate may not be properly separated from the remainder of the workpiece and/or damaged in the cutting process.

Hence, there remains a need for a method of processing a workpiece, such as a wafer, a substrate or an ingot, which allows for the workpiece to be processed in an efficient and reliable manner and for a system for performing such a method.

SUMMARY OF THE INVENTION

Accordingly, it is an object of the present invention to provide a method of processing a workpiece, such as a wafer, a substrate or an ingot, which allows for the workpiece to be processed in an efficient and reliable manner. Further, the invention aims to offer a workpiece processing system for performing this method. These goals are achieved by a workpiece processing method with the technical features of claim 1 and a workpiece processing system with the technical features of claim 12. Preferred embodiments of the invention follow from the dependent claims.

The invention provides a method of processing a workpiece having a first surface, a second surface opposite the first surface, and a third surface extending between the first and second surfaces. The method comprises forming modified regions inside the workpiece so as to create openings in the workpiece. The openings extend to at least one of the first surface, the second surface and the third surface. The method further comprises, after forming the modified regions inside the workpiece, introducing a liquid medium into at least some of the openings, and, after introducing the liquid medium into the at least some of the openings, applying an external stimulus to the liquid medium so as to increase the volume of the medium.

In the method of the invention, modified regions are formed inside or within the workpiece. The modified regions are regions of the workpiece which have been modified, e.g., by the application of an external stimulus, such as radiation, for example, by using a laser beam. The modified regions may be regions of the workpiece in which the structure of the workpiece material has been modified. The modified regions may be regions of the workpiece in which the workpiece has been damaged.

The modified regions may be formed so as to be arranged entirely inside or within the workpiece, i.e., so as not to extend to any one of the first surface, the second surface and the third surface. The modified regions may be formed so that at least some or all of the modified regions extend to at least one of the first surface, the second surface and the third surface.

The openings may extend from the modified regions to at least one of the first surface, the second surface and the third surface.

The method of the invention comprises forming the modified regions inside the workpiece so as to create openings in the workpiece. The openings extend to at least one of the first surface, the second surface and the third surface, i.e., the openings are open to at least one of the first surface, the second surface and the third surface. Thus, the liquid medium can enter into the openings from the outside of the workpiece.

After forming the modified regions inside the workpiece, the liquid medium is introduced into at least some or all of the openings. After introducing the liquid medium into the at least some or ail of the openings, the external stimulus is applied to the liquid medium so as to increase the volume of the medium. The external stimulus is applied to the liquid medium which has been introduced into the at least some or all of the openings so as to increase the volume of the medium in the openings.

Increasing the volume of the medium received in the openings causes an increase in the sizes or extensions of the openings along the surface or surfaces to which they extend. Hence, the strength of the workpiece in the areas thereof in which the openings are present is significantly reduced. Therefore, these areas can serve as efficient separation or division starting points or regions, greatly facilitating the process of dividing the workpiece. The increase of the volume of the medium by the application of the external stimulus can even cause a complete division or separation of the workpiece. Hence, it can be reliably ensured that the workpiece is fully divided, without damaging the resulting separate parts of the workpiece, such as chips or dies.

The present invention thus provides a method of processing a workpiece which allows for the workpiece to be processed in an efficient and reliable manner.

The external stimulus may be applied to the liquid medium so as to increase the specific volume of the medium.

The workpiece may be, for example, a wafer, a substrate or an ingot.

The method of the present invention may be used, e.g., for dividing a wafer or a substrate as a workpiece into a plurality of separate components, e.g., chips or dies.

The method of the present invention may be used, e.g., for obtaining a substrate or a wafer from a workpiece, such as an ingot or a thicker substrate, i.e., a substrate which is thicker than the substrate or wafer to be obtained therefrom. The workpiece, such as an ingot or a thicker substrate, may have a thickness of 1 mm or more or a thickness of 2 mm or more. The thickness of the workpiece is determined in the direction from the first surface towards the second surface of the workpiece.

The first and second surfaces of the workpiece may be substantially parallel to each other. The third surface of the workpiece may be substantially perpendicular to the first and/or second surfaces of the workpiece.

The workpiece may be, for example, made of a semiconductor, glass, sapphire ($Al_2O_3$), a ceramic, such as an alumina ceramic, quartz, zirconia, PZT (lead zirconate titanate), a polycarbonate, an optical crystal material or the like.

In particular, the workpiece may be, for example, made of silicon carbide (SiC), silicon (Si), gallium arsenide (GaAs), gallium nitride (GaH), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like.

The workpiece may be a single crystal workpiece, a glass workpiece, a compound workpiece, such as a compound semiconductor workpiece, e.g., a SiC, GaAs or GaN workpiece, or a polycrystalline workpiece, such as a ceramic workpiece.

The workpiece may be a wafer. For example, the workpiece may be a bonded wafer, i.e., a wafer in which two or more wafer materials are bonded together. The wafer materials of the bonded wafer may be the same wafer materials or different wafer materials. The wafer materials of the bonded wafer may be chosen from the materials given above.

At least one division line or a plurality of division lines may be formed, e.g., on the first surface of the workpiece.

The modified regions may be formed inside the workpiece in a plurality of positions along the at least one division line or the plurality of division lines.

A device area with a plurality of devices may be formed, e.g., on the first surface of the workpiece. The devices may be partitioned by at least one division line or by a plurality of division lines. The device area may comprise devices such as semiconductor devices, optical devices, electrical components etc. The devices may comprise or be, for example, transistors, such as MOSFETs or insulated-gate bipolar transistors (IGBTs), or diodes, e.g., Schottky barrier diodes.

Forming the modified regions inside the workpiece may comprise or consist of applying a laser beam to the workpiece. In this way, the modified regions can be formed in a particularly efficient manner.

The modified regions may be regions of the workpiece which have been modified by the application of the laser beam. For example, the modified regions may be regions of the workpiece in which the structure of the workpiece material has been modified by the application of the laser beam. The modified regions may be regions of the workpiece in which the workpiece has been damaged by the application of the laser beam.

The laser beam may be a pulsed laser beam. The pulsed laser beam may have a pulse width, for example, in the range of 1 fs to 1000 ns.

The laser beam may be applied to the workpiece from the side of the first, surface of the workpiece. The laser beam may be applied to the workpiece from the side of the second surface of the workpiece. The laser beam may be applied to the workpiece from the side of the third surface of the workpiece.

The laser beam may be applied to the workpiece at least, in a plurality of positions along the at least one division line or the plurality of division lines.

The workpiece may be made of a material which is transparent to the laser beam. Thus, the laser beam may have a wavelength which allows transmission of the laser beam through the workpiece. The laser beam may be applied to the workpiece in a condition where a focal point of the laser beam is located inside or within the workpiece. Alternatively, the laser beam may be applied to the workpiece in a condition where the focal point of the laser beam is located at or on the first surface, at or on the second surface or at or on the third surface of the workpiece.

Alternatively, the laser beam may be applied to the workpiece in a condition where the focal point of the laser beam is located outside the workpiece.

The laser beam may be applied to the workpiece so as to form a plurality of hole regions in the workpiece. Each hole region may be composed of a modified region and an opening in the modified region extending to, i.e., being open to, at least one of the first surface, the second surface and the third surface. The modified region may surround the opening.

Applying the external stimulus to the liquid medium may comprise or consist of heating the liquid medium or cooling the liquid medium. In this way, the external stimulus can be applied in a simple and efficient manner.

For example, the liquid medium may be heated so as to increase the volume, in particular, the specific volume, of the liquid medium.

Applying the external stimulus to the liquid medium may comprise or consist of applying an electric field and/or a magnetic field to the liquid medium. Applying the external stimulus to the liquid medium may comprise or consist of subjecting the liquid medium to an electric influence and/or a magnetic influence. This approach may be adopted, for example, if the liquid medium comprises or consists of liquid crystals.

An electric field and/or a magnetic field may be applied to the liquid medium so as to increase the volume, in particular, the specific volume, of the liquid medium.

Applying the external stimulus to the liquid medium may induce a phase transition of the liquid medium so as to increase the volume of the medium. The external stimulus may be applied to the liquid medium so as to induce a phase transition of the liquid medium. The phase transition of the liquid medium may be a transition from the liquid phase to the solid phase or a transition from the liquid phase to the gas phase or vapour phase.

Applying the external stimulus to the liquid medium so as to induce a phase transition of the liquid medium allows for the volume of the medium to be increased in a particularly efficient manner.

The liquid medium may be cooled so as to induce a phase transition of the medium from the liquid phase to the solid phase. For example, the liquid medium may be frozen by cooling the medium. This approach may be adopted, e.g., if the liquid medium comprises or consists of water, for example, deionized water.

The liquid medium may be heated so as to induce a phase transition of the medium from the liquid phase to the gas phase or vapour phase. For example, the liquid medium may be evaporated by heating the medium. This approach may be adopted, e.g., if the liquid medium comprises or consists of isopropanol or a liquid gas, such as liquid carbon dioxide ($CO_2$) or liquid nitrogen ($N_2$).

The openings created in the workpiece may be cracks in the workpiece. The cracks may originate from the modified regions formed inside the workpiece. The cracks may extend from the modified regions to at least one of the first surface, the second surface and the third surface.

For example, the modified regions may be regions of the workpiece in which the structure of the workpiece material has been modified and/or in which the workpiece has been damaged. The structural modification and/or damage may cause the formation of cracks extending to at least one of the first surface, the second surface and the third surface.

Increasing the volume of the medium received in the cracks results in an increase in the sizes or extensions of the cracks along the surface or surfaces to which they extend, causing the cracks to propagate along the surface or surfaces. Hence, the strength of the workpiece in the areas thereof in which the cracks are present can be reduced in a particularly efficient manner.

The liquid medium may be introduced into the at least, some or all of the openings by applying the liquid medium or a vapour of the liquid medium to at least one of the first surface, the second surface and the third surface to which the openings extend so that at least a portion of the liquid medium at least partially or fully enters into the openings. If a vapour of the liquid medium is applied to the at least one of the first surface, the second surface and the third surface, the vapour may condense on the surface to which it is applied and/or in the openings.

For example, the liquid medium may be sprayed or poured onto the at least one of the first surface, the second surface and the third surface to which the openings extend.

The workpiece may be fully or partially immersed in the liquid medium. For example, the liquid medium may be received in a container, such as a tank or the like, and the workpiece may be placed into the container. Alternatively, a liquid barrier, such as a wall, may be provided around the workpiece and the space enclosed by the liquid barrier may be at least partially or fully filled with the liquid medium.

The liquid medium applied to the workpiece may be drawn into the openings by capillary forces.

The liquid medium may comprise or consist of liquid crystals. The liquid medium may comprise or consist of isopropanol or a liquid gas, such as liquid carbon dioxide ($CO_2$) or liquid nitrogen ($N_2$).

The liquid medium may comprise or consist of water, for example, pure water or deionized water. Particularly preferably, the liquid medium is water. In this case, the method of the invention can be performed in a particularly simple and efficient manner.

The at least, one of the first surface, the second surface and the third surface to which the openings extend may be treated, e.g., pretreated, so as to enhance the wettability of the surface or surfaces with the liquid medium. Alternatively or in addition, the composition or material of the liquid medium may be chosen so as to achieve a high degree of wettability of the surface or surfaces with the liquid medium. In this manner, it can be ensured that the liquid medium is efficiently spread over the surface or surfaces and reliably enters into the openings.

The liquid medium may be a pure liquid, such as water, e.g., deionized water.

The liquid medium may contain or consist of a plurality, e.g., two or more, constituents.

The liquid medium may contain a surfactant. For example, the liquid medium may contain or consist of water and a surfactant.

By choosing a liquid medium containing a surfactant, a particularly high degree of wettability of the surface or surfaces of the workpiece with the liquid medium can be achieved, thus ensuring efficient and reliable introduction of the liquid medium into the openings. Using a liquid medium containing a surfactant can be particularly beneficial, for example, if the workpiece is made of SiC.

The modified regions may comprise or be amorphous regions or regions in which cracks are formed.

The modified regions may each comprise a space, e.g., a cavity, inside the workpiece material, the space being surrounded by an amorphous region or a region in which cracks are formed.

The modified regions may each be composed of a space, e.g., a cavity, inside the workpiece material and an amorphous region or a region in which cracks are formed surrounding the space.

If the modified regions comprise or are regions in which cracks are formed, i.e., cracks have been formed, the cracks may be microcracks. The cracks may have dimensions, e.g., lengths and/or widths, in the µm range. For example, the cracks may have widths in the range of 0.1 µm to 50 µm and/or lengths in the range of 10 µm to 2000 µm.

The modified regions may have diameters in the range of 0.1 µm to 30 µm, preferably 2 µm to 20 µm and more preferably 3 µm to 10 µm.

The method of the invention may further comprise dividing or separating the workpiece. The step of dividing or separating the workpiece may be performed after applying the external stimulus to the liquid medium so as to increase the volume of the medium. For example the workpiece may be a wafer or substrate which is divided into a plurality of chips or dies. Alternatively, the workpiece may be, e.g., an ingot from which a substrate or a wafer is separated.

Dividing or separating, in particular, fully dividing or separating, the workpiece may comprise or consist of applying an external force to the workpiece. For example, an external force may be applied to the workpiece by attaching the workpiece to an expansion tape and radially expanding the expansion tape.

Increasing the volume of the medium received in the openings causes an increase in the sizes or extensions of the openings along the surface or surfaces to which they extend, thus significantly reducing the strength of the workpiece in the areas thereof in which the openings are present. Hence, these areas serve as efficient separation or division starting points or regions, greatly facilitating the process of dividing the workpiece. In particular, if an external force is applied to the workpiece, e.g., by using an expansion tape, the workpiece is reliably divided along these areas.

As has been described above, the increase of the volume of the medium by the application of the external stimulus may cause a complete division or separation of the workpiece. In this case, no additional step of dividing or separating the workpiece is required. Nevertheless, the workpiece may be attached to an expansion tape. After increasing the volume of the medium, the expansion tape may be radially expanded in order to increase the distance between the separated components of the workpiece, such as chips or dies. In this way, any damage to these components due to unintentionally touching or rubbing against each other can be reliably prevented.

The invention further provides a system for processing a workpiece having a first surface, a second surface opposite the first surface, and a third surface extending between the first and second surfaces. The system comprises a modified region forming means configured to form modified regions inside the workpiece so as to create openings in the workpiece, the openings extending to at least one of the first surface, the second surface and the third surface. The system further comprises a liquid medium supplying means configured to introduce a liquid medium into at least some of the openings, and an external stimulus applying means configured to apply an external stimulus to the liquid medium introduced into the at least some of the openings so as to increase the volume of the medium.

The workpiece processing system of the invention is a system configured for performing the workpiece processing method of the invention. The workpiece processing system thus provides the technical effects and advantages already described in detail above for the workpiece processing method.

The features described above for the workpiece processing method of the invention also apply to the workpiece processing system of the invention.

The workpiece, the modified regions, the openings, the liquid medium and the external stimulus may be the same as described above.

The workpiece processing system may comprise a control for controlling the components of the system. The control may comprise a plurality of control units, e.g., control units for controlling different components of the system.

The control may be configured to control the workpiece processing system so as to perform the workpiece processing method of the invention.

The control may be configured to control the modified region forming means so as to form the modified regions inside the workpiece so as to create the openings in the workpiece, the openings extending to at least one of the first surface, the second surface and the third surface. The control may be configured to control the liquid medium supplying means so as to introduce the liquid medium into the at least some of the openings, after forming the modified regions inside the workpiece. The control may be configured to control the external stimulus applying means so as to apply the external stimulus to the liquid medium introduced into the at least some of the openings so as to increase the volume of the medium.

The modified region forming means may comprise or consist of a laser beam applying means configured to apply a laser beam to the workpiece. Forming the modified regions inside the workpiece may comprise or consist of applying the laser beam to the workpiece.

The laser beam applied to the workpiece by the laser beam applying means may have a wavelength that allows transmission of the laser beam through the workpiece. The laser beam applying means may be configured to apply the laser beam to the workpiece in a condition where a focal point of the laser beam is located inside or within the workpiece.

The laser beam applying means may be configured to apply the laser beam to the workpiece in a condition where the focal point of the laser beam is located at or on the first surface, at or on the second surface or at or on the third surface of the workpiece.

The laser beam applying means may be configured to apply the laser beam to the workpiece in a condition where the focal point of the laser beam is located outside the workpiece.

The laser beam applying means may be configured to apply a pulsed laser beam to the workpiece. The pulsed laser beam may have a pulse width, for example, in the range of 1 fs to 1000 ns.

The laser beam applying means may be configured to apply the laser beam to the workpiece from the side of the first surface of the workpiece. The laser beam applying means may be configured to apply the laser beam to the workpiece from the side of the second surface of the workpiece. The laser beam applying means may be configured to apply the laser beam to the workpiece from the side of the third surface of the workpiece.

The laser beam applying means may be configured to apply the laser beam to the workpiece at least in a plurality of positions along at least one division line or a plurality of division lines formed on the first surface of the workpiece.

The liquid medium supplying means may be configured to apply the liquid medium or a vapour of the liquid medium to at least one of the first surface, the second surface and the third surface to which the openings extend. The liquid medium supplying means may be configured to introduce the liquid medium into the at least some of the openings by applying the liquid medium or a vapour of the liquid medium to at least one of the first surface, the second surface and the third surface to which the openings extend.

For example, the liquid medium supplying means may be configured to spray or pour the liquid medium onto the at least one of the first surface, the second surface and the third surface to which the openings extend.

The liquid medium supplying means may be configured for fully or partially immersing the workpiece in the liquid medium.

For example, the liquid medium supplying means may comprise or consist of a container, such as a tank or the like, in which the liquid medium is received. The liquid medium supplying means may be configured for placing the workpiece into the container. The liquid medium supplying means may be configured for fully or partially immersing the workpiece in the liquid medium received in the container.

The liquid medium supplying means may comprise a liquid barrier, such as a wall, for being provided around the workpiece. The liquid medium supplying means may be configured to at least partially or fully fill the space enclosed by the liquid barrier with the liquid medium.

The external stimulus applying means may comprise or consist of a heating means and/or a cooling means. The heating means may be configured to heat the liquid medium. The cooling means may be configured to cool the liquid medium.

The external stimulus applying means may comprise or consist of an electric field applying means and/or a magnetic field applying means. The electric field applying means may be configured to apply an electric field to the liquid medium. The magnetic field applying means may be configured to apply a magnetic field to the liquid medium. The external stimulus applying means may comprise or consist of a combined electric field and magnetic field applying means. The combined electric field and magnetic field applying means may be configured to apply an electric field and a magnetic field to the liquid medium.

The external stimulus applying means may be configured to apply the external stimulus to the liquid medium so as to induce a phase transition of the liquid medium. The phase transition of the liquid medium may be a transition from the liquid phase to the solid phase or a transition from the liquid phase to the gas phase or vapour phase.

The cooling means may be configured to cool the liquid medium so as to induce a phase transition of the medium from the liquid phase to the solid phase. For example/the cooling means may be configured to freeze the medium.

The heating means may be configured to heat the liquid medium so as to induce a phase transition of the medium from the liquid phase to the gas phase or vapour phase. For example, the heating means may be configured to evaporate the liquid medium.

The system for processing a workpiece may further comprise a dividing means configured to divide or separate the workpiece. The dividing means may be configured to divide or separate the workpiece after applying the external stimulus to the liquid medium so as to increase the volume of the medium.

The dividing means may comprise or consist of an external force applying means. The external force applying means may be configured to apply an external force to the workpiece. The external force applying means may be configured to apply an external force to the workpiece by radially expanding an expansion tape to which the workpiece is attached.

The system fox processing a workpiece may further comprise a radial expansion means configured to radially expand an expansion tape, in particular, an expansion tape to which the workpiece is attached.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a workpiece and to workpiece processing systems for performing these methods.

In the following, a first embodiment of the present invention will be described with reference to FIGS. 1 to 9.

Figure 1:
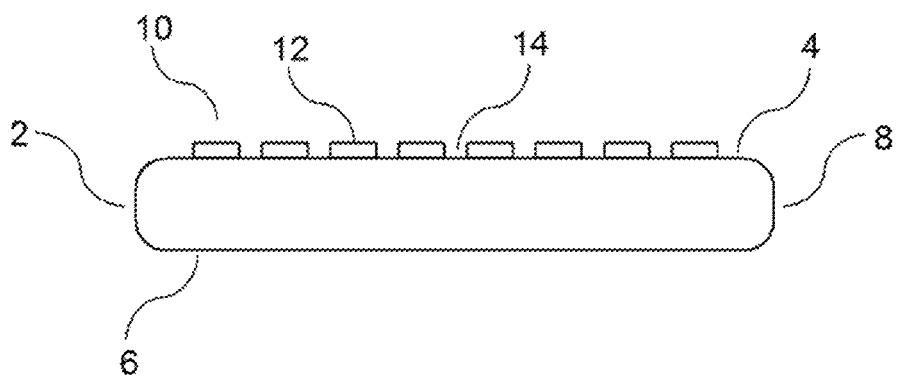
FIG. 1 is a cross-sectional view showing a wafer as a workpiece to be processed by a method according to a first embodiment of the present invention.
Figure 2:
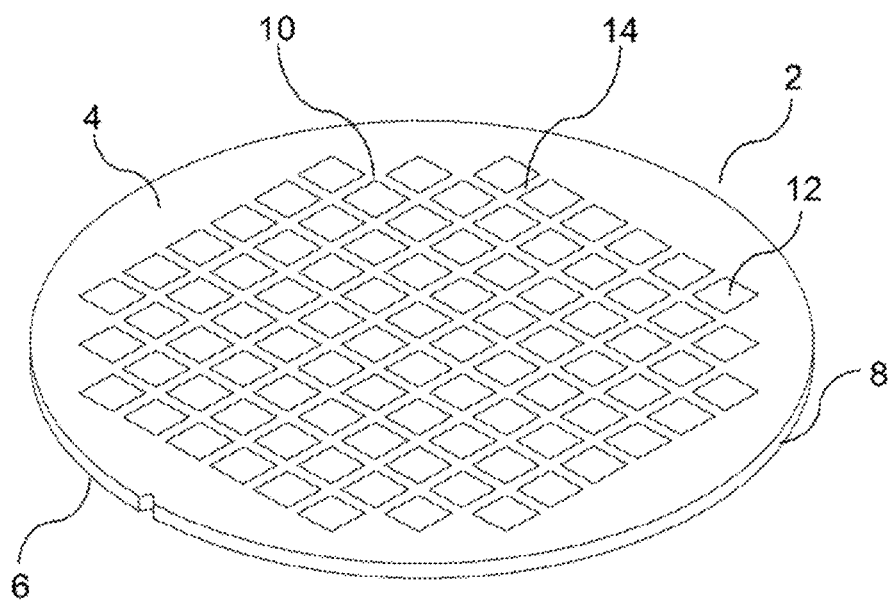
FIG. 2 is a perspective view of the wafer shown in FIG. 1.

In the first embodiment, the method of the invention is performed on a wafer 2 as a workpiece (see, for example, FIGS. 1 and 2). In particular, the wafer 2 may be a semiconductor wafer, such as a Si wafer or a SiC wafer. However, different types of workpiece and, in particular, different workpiece materials may be used, as has been detailed above.

As is shown in FIG. 1, the wafer 2 has a first surface 4, i.e., a front surface, and a second surface 6, i.e., a back surface, opposite the first surface 4. The first surface 4 and the second surface 6 are substantially parallel to each other. Further, the wafer 2 has a third surface 6, i.e., a side surface, extending between the first and second surfaces 4, 6 along the circumference of the wafer 2.

On the first surface 4, a device area 10 with a plurality of devices 12 is formed. The devices 12 are partitioned by a plurality of division lines 14 which are also formed on the first surface 4. The division lines 14 are substantially arranged in a lattice pattern. The devices 12 may comprise or be, for example, transistors, such as MOSFETs or insulated-gate bipolar transistors (IGBTs), or diodes, e.g., Schottky barrier diodes.

Figure 3:
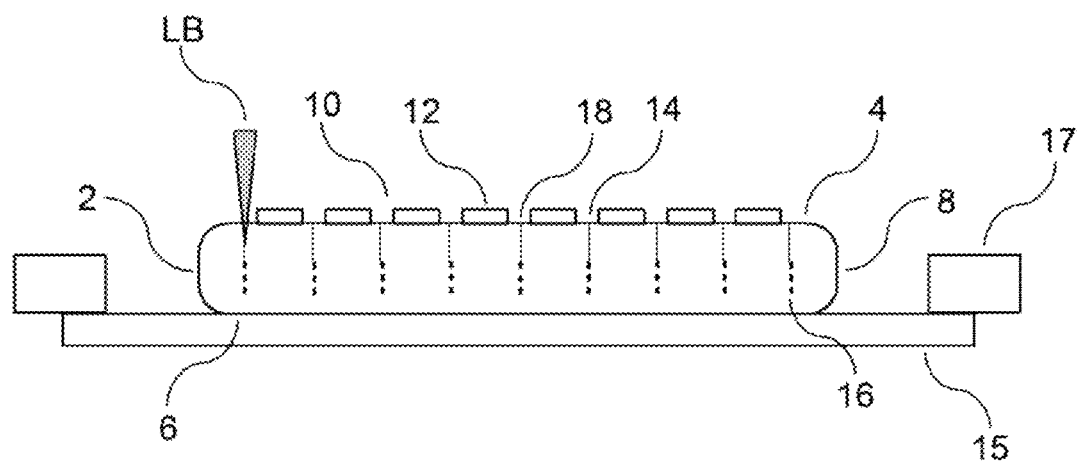
FIG. 3 is a cross-sectional view illustrating a step of applying a laser beam to the wafer, thereby forming modified regions inside the wafer, in the method according to the first embodiment.

A pulsed laser beam LB is applied to the wafer 2 from the side of the first surface 4, as is indicated by an arrow in FIG. 3. The pulsed laser beam LB may have a pulse width, for example, in the range of 1 fs to 1000 ns.

The pulsed laser beam LB is applied to the wafer 2 by a laser beam applying means (not shown) of a workpiece processing system (not shown) according to an embodiment of the present invention. In this embodiment, the laser beam applying means constitutes a modified region forming means of the system.

During the process of applying the pulsed laser beam LB to the wafer 2, the wafer 2 is supported by a sheeting 15 and an annular frame 17, as is shown in FIG. 3. Specifically, the second surface 6 of the wafer 2 is attached to the sheeting 15. The sheeting 15 may be an expansion tape, a dicing tape or a protective sheeting, e.g., comprising or consisting of a protective film or sheet. The sheeting if) is supported at a peripheral portion thereof by the annular frame 17, so as to close an inner opening of the annular frame 17 by the sheeting 15.

The sheeting 15 may be provided with an adhesive layer (not shown) for attaching the sheeting 15 to the second surface 6 of the wafer 2. The adhesive layer may be arranged on an entire front surface of the sheeting 15 or only in a peripheral area of the front surface of the sheeting 15. In this latter case, in a central area of the front surface of the sheeting 15, the front surface of the sheeting 15 and the second surface 6 are in direct contact with each other. Thus, the risk of a possible contamination of or damage to the second surface 6 due to the adhesive force of the adhesive layer or adhesive residues on the wafer 2 can be significantly reduced or even eliminated.

Alternatively, the entire front surface of the sheeting 15 and the second surface 6 may be in direct contact with each other. In this case, no material, in particular, no adhesive, is present between the entire front surface of the sheeting 15 and the second surface 6. The sheeting 15 may be attached to the second surface 6 by applying an external stimulus to the sheeting 15 during and/or after applying the sheeting 15 to the second surface 6. Applying the external stimulus to the sheeting 15 may comprise or consist of heating the sheeting 15 and/or cooling the sheeting 15 and/or applying a vacuum to the sheeting 15 and/or irradiating the sheeting 15 with radiation, such as light, e.g., by using a laser beam. The external stimulus may comprise or be a chemical compound and/or electron or plasma irradiation and/or mechanical treatment, such as pressure, friction or ultrasound application, and/or static electricity.

The use of the sheeting 15 and the annular frame 17 facilitates handling and transport of the wafer 2. Further, e.g., if an expansion tape is employed as the sheeting 15, the sheeting 15 can be radially expanded at a later stage in order to fully divide the wafer 2 or to space divided components of the wafer 2 from each other, as will be further detailed below with reference to FIG. 8.

The material of the wafer 2, e.g., Si or SiC, is transparent to the pulsed laser beam LB so that the pulsed laser beam LB is transmitted through the wafer 2. The pulsed laser beam LB is applied to the wafer 2 in a condition where a focal point of the pulsed laser beam LB is located inside the wafer 2.

The pulsed laser beam LB is applied to the wafer 2 in a plurality of positions along the division lines 14. Further, along each of the division lines 14, the focal point of the pulsed laser beam LB is arranged at three different depths within the wafer 2, i.e., the position of the focal point is shifted along the thickness direction of the wafer 2. The thickness direction of the wafer 2 extends from the first surface 4 towards the second surface 6.

In other embodiments, along each of the division lines 14, the focal point of the pulsed laser beam LB may be arranged at one single depth, at two different depths or at more than three different depths within the wafer 2. In general, along each of the division lines 14, the focal point of the pulsed laser beam LB may be arranged at one or more depths within the wafer 2.

By applying the pulsed laser beam LB to the wafer 2 in this manner, three rows of modified regions 16 are formed along each division line 14. The rows of modified regions 16 extending along the division lines 14 are staggered in the thickness direction of the wafer 2, i.e., arranged at different distances front the first surface 4 in this thickness direction. The modified regions 16 may be amorphous regions or regions in which cracks are formed.

Forming the modified regions 16 in the wafer 2 induces stress in the wafer 2 in the areas where the modified regions 16 are formed. This stress causes the creation of cracks 18 in the wafer 2 extending from the modified regions 16 to the first surface 4, as is shown in FIG. 3. The cracks 18 are present in the areas of the wafer 2 where the modified regions 16 are formed and, thus, are arranged along the division lines 14. The cracks 18 are examples of openings in the wafer 2 and are open to the first surface 4.

In other embodiments of the present invention, a laser beam, e.g., a pulsed laser beam, may be applied to the wafer 2 so as to form a plurality of hole regions in the wafer 2, wherein each hole region may be composed of a modified region and an opening in the modified region extending to the first surface 4.

Figure 4:
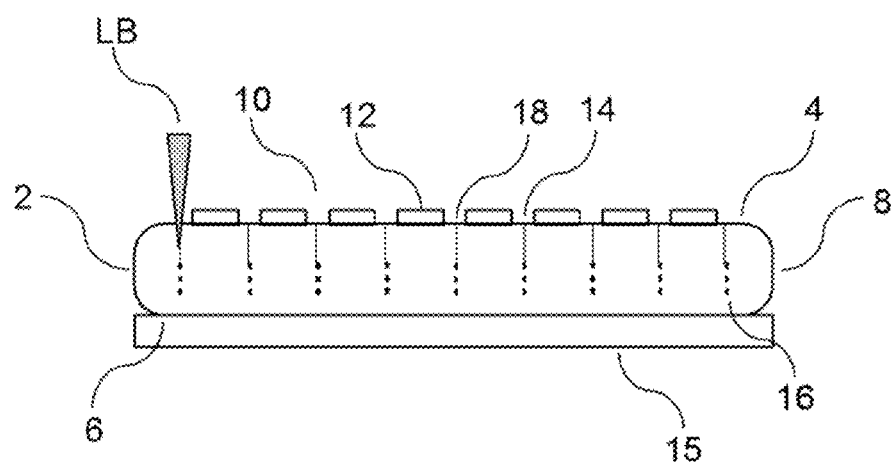
FIG. 4 is a cross-sectional view illustrating a step of applying a laser beam to the wafer, thereby forming modified regions inside the wafer, in a method according to a modification of the first embodiment.

A step of applying the pulsed laser beam LB to the wafer 2, thereby forming the modified regions 16 inside the wafer 2, in a method according to a modification of the first embodiment is illustrated in FIG. 4. This step differs from the corresponding step of the method of the first embodiment (see FIG. 3) only in that the sheeting 15 has substantially the same size and shape as the wafer 2 and in that no annular frame, such as the annular frame 17, is used for supporting the wafer 2 during the application of the pulsed laser beam LB thereto. Alternatively, the size of the sheeting 15 may be smaller or larger than the size of the wafer 2. In particular, a diameter of the sheeting 15 may be smaller or larger than a diameter of the wafer 2, e.g., by a few millimeters, such as 2 mm or less, 3 mm or less, 4 mm or less, 5 mm or less, 6 mm or less, 8 mm or less or 10 mm or less. For example, in the modified method, the wafer 2 with the sheeting 15 attached thereto may be supported by a support member (not shown), such as a chuck table, of the workpiece processing system.

In a method according to a further modification of the first embodiment, no sheeting and no annular frame, such as the sheeting 15 and the annular frame 17, may be used for supporting the wafer 2 during the application of the pulsed laser beam LB thereto. For example, in this further modified method, the wafer 2 may be supported by a support member (not shown), such as a chuck table, of the workpiece processing system.

Figure 5:
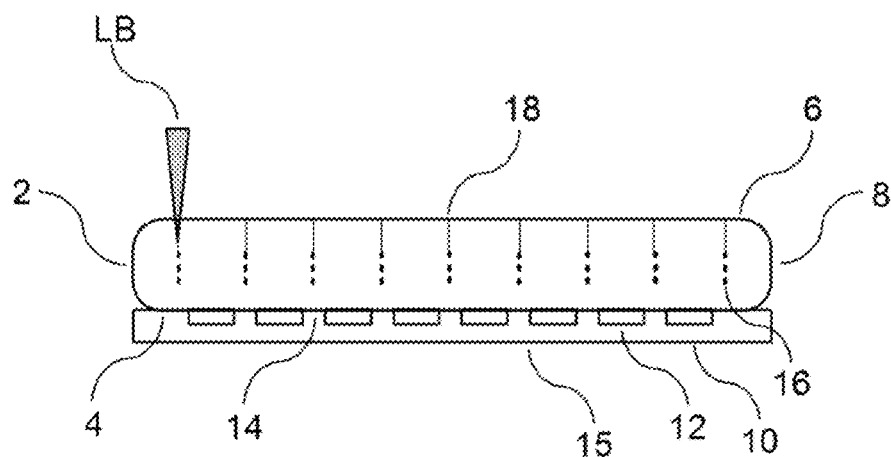
FIG. 5 is a cross-sectional view illustrating a step of applying a laser beam to the wafer, thereby forming modified regions inside the wafer, in a method according to a further modification of the first embodiment.

A step of applying the pulsed laser beam LB to the wafer 2, thereby forming the modified regions 16 inside the wafer 2, in a method according to a further modification of the first embodiment is illustrated in FIG. 5. This step differs from the corresponding step of the method of the first embodiment (see FIG. 3) in that the pulsed laser beam LB is applied to the wafer 2 from the side of the second surface 6. Moreover, as in the modified method illustrated in FIG. 4, the sheeting 15 has substantially the same size and shape as the wafer 2 and no annular frame is used for supporting the wafer 2 during the application of the pulsed laser beam LB thereto. The sheeting 15 is attached to the first surface 4 of the wafer 2.

Alternatively, the size of the sheeting 15 may be smaller or larger than the size of the wafer 2. In particular, a diameter of the sheeting 15 may be smaller or larger than a diameter of the wafer 2, e.g., by a few millimeters, such as 2 mm or less, 3 mm or less, 4 mm or less, 5 mm or less, 6 mm or less, 8 mm or less or 10 mm or less.

In the modified method illustrated in FIG. 5, the stress induced in the wafer 2 by the formation of the modified regions 16 causes the creation of cracks 18 in the wafer 2 extending from the modified regions 16 to the second surface 6.

The method according to the modification shown in FIG. 5 may be further modified by omitting the sheeting 15. In this case, no sheeting and no annular frame, such as the sheeting 15 and the annular frame 17, are used for supporting the wafer 2 during the application of the pulsed laser beam LB thereto. For example, in this further modified method, the wafer 2 may be supported by a support member (not shown), such as a chuck table, of the workpiece processing system.

Figure 6:
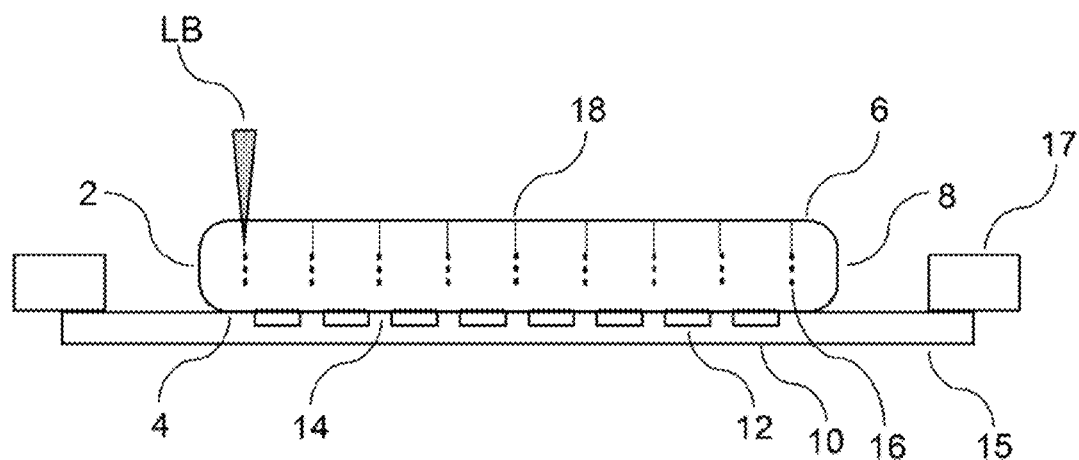
FIG. 6 is a cross-sectional view illustrating a step of applying a laser beam to the wafer, thereby forming modified regions inside the wafer, in a method according to yet a further modification of the first embodiment.

The modified method illustrated in FIG. 5 may be further modified by using a sheeting and an annular frame, such as the sheeting 15 and the annular frame 17 (see FIG. 9), for supporting the wafer 2 during the application of the pulsed laser beam LB thereto. This further modification is illustrated in FIG. 6. The first surface 4 of the wafer 2 may be attached to the sheeting 15 substantially in the same manner as described above with reference to FIG. 3. As is shown in FIG. 6, the sheeting 15 is supported at the peripheral portion thereof by the annular frame 17, so as to close the inner opening of the annular frame 17 by the sheeting 15.

Figure 7:
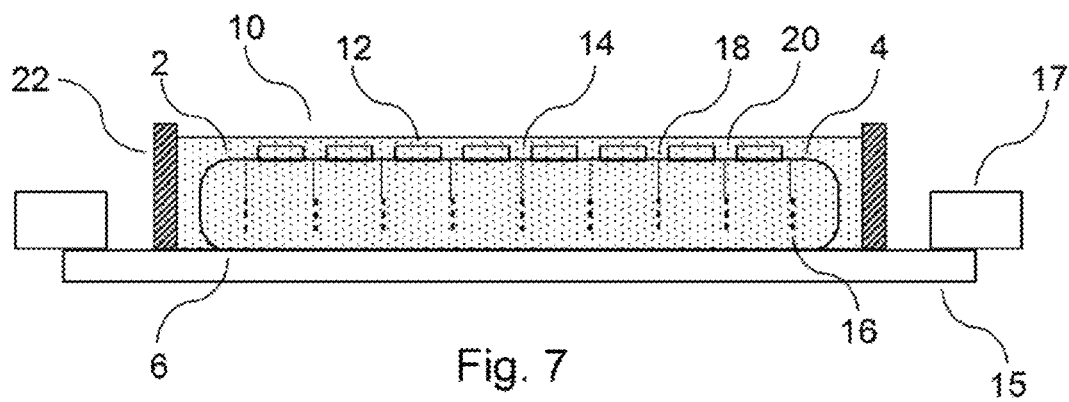
FIG. 7 is a cross-sectional view illustrating a step of immersing the wafer in a liquid medium in the method according to the first embodiment.

In the method of the first embodiment, after forming the modified regions 16 inside the wafer 2, thus creating the cracks 13 in the wafer 2, the wafer 2 is fully immersed in a liquid medium 20, as is shown in FIG. 7. Specifically, a liquid barrier 22 in the form of an annular wall is provided around the wafer 2 and the space enclosed by the liquid barrier 22 and the sheeting 15 is filled with the liquid medium 20.

The liquid medium 20 is supplied to the space enclosed by the liquid barrier 22 and the sheeting 15 by a liquid medium supplying means (not shown) of the workpiece processing system (not shown). The liquid medium supplying means may comprise the liquid barrier 22.

In the present embodiment, the liquid medium 20 is water, for example, deionized water. However, other types of liquid medium may be used, such as isopropanol or a liquid gas, e.g., liquid carbon dioxide ($CO_2$) or liquid nitrogen ($N_2$), as has been detailed above. In some embodiments, the liquid medium 20 may contain a surfactant. For example, the liquid medium 20 may contain or consist of water and a surfactant.

The liquid medium 20, in which the wafer 2 is immersed, is drawn into the cracks 18 in the wafer 2 by capillary forces and thus introduced into these cracks 18.

In the method of the first embodiment, the wafer 2 is fully immersed in the liquid medium 20 in order to introduce the liquid medium 20 into the cracks 16. However, in other embodiments, the liquid medium 20 may be introduced into the cracks 18 in a different way, as has been detailed above. For example, the liquid medium 20 may be sprayed or poured onto the first surface 4.

After immersing the wafer 2 in the liquid medium 20, thereby introducing the liquid medium 20 into the cracks 18, an external stimulus is applied to the liquid medium 20 so as to increase the volume of the medium 20 in the cracks 18. Specifically, the combination of the wafer 2, the sheeting 15, the annular frame 17, the liquid medium 20 and the liquid barrier 22 shown in FIG. 7 is placed in a freezer (not shown), thereby cooling the liquid medium 20 introduced in the cracks 18, so as to induce a phase transition of the medium 20 from the liquid phase to the solid phase. For example, the wafer 2 immersed in the medium 20 may be kept in the freezer for more than one hour. In some embodiments, the immersed wafer 2 may be kept in the freezer for one hour or less. Thus, the liquid medium 20 is frozen by cooling the medium 20, i.e., the liquid medium 20 in the form of water is turned into ice. By inducing such a phase transition of the liquid medium 20, the volume of the medium 20 in the cracks 18 is increased in a particularly efficient manner.

Alternatively, the wafer 2 may be placed on a cooling device (not shown), e.g., a thermoelectric cooling device, such as a Peltier cooling device, e.g., after removing the wafer 2 from the immersion bath. Also in this way, the liquid medium 20 introduced in the cracks 18 is cooled, so as to induce a phase transition of the medium 20 from the liquid phase to the solid phase. By using such a cooling device, the cooling time required for inducing the phase transition can be considerably shortened, for example, to a time in the range of a few seconds to a few minutes.

The required cooling time can be further reduced, e.g., to a few seconds, by using a liquid gas or liquid gases, such as liquid carbon dioxide ($CO_2$) or liquid nitrogen ($N_2$), for cooling the liquid medium 20. In this way, the phase transition of the medium 20 can be induced in a particularly quick and efficient manner.

After keeping the combination of the wafer 2, the sheeting 15, the annular frame 17, the medium 20 and the liquid barrier 22 in the freezer, e.g., for a time of more than one hour, it is taken out of the freezer and the wafer 2 is defrosted. In particular, the wafer 2 may be heated so as to melt the ice generated by freezing the liquid medium 20. In some embodiments, the steps of freezing the liquid medium 20 and melting the frozen liquid medium 20 may be repeated one or more times, preferably two or more times. In this way, it can be particularly reliably ensured that the liquid medium 20 fully penetrates into the cracks 18.

Subsequently, the melted liquid medium 20 may be removed from the wafer 2.

The freezer is an example of a cooling means which is configured to cool the liquid medium 20. In the present embodiment, the freezer constitutes an external stimulus applying means of the workpiece processing system (not shown).

The cooling device, e.g., a thermoelectric cooling device, such as a Peltier cooling device, is a further example of a cooling means which is configured to cool the liquid medium 20. In some embodiments, the cooling device constitutes an external stimulus applying means of the workpiece processing system.

Further examples of cooling means may be configured to cool the liquid medium 20 by using a liquid gas or liquid gases, such as liquid carbon dioxide ($CO_2$) or liquid nitrogen ($N_2$). Also such a cooling means may constitute an external stimulus applying means of the workpiece processing system.

Figure 8:
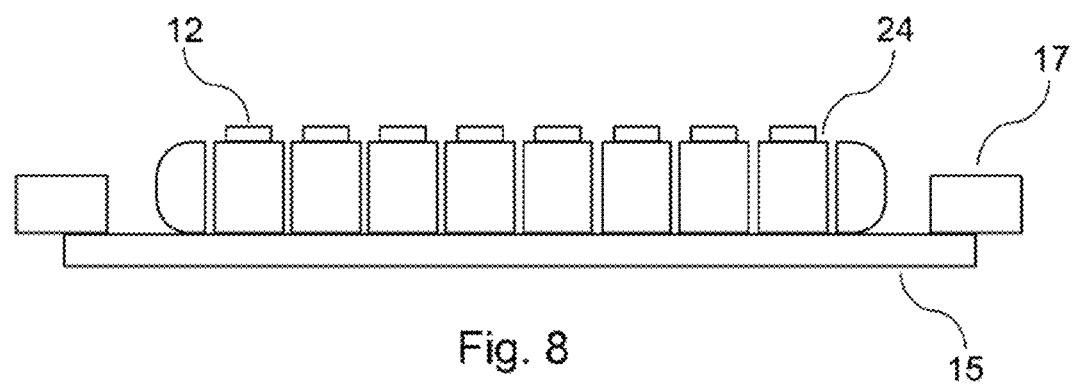
FIG. 8 is a cross-sectional view showing the outcome of a step of dividing the wafer in the method according to the first embodiment.

Increasing the volume of the medium 20 received in the cracks 18 in the manner detailed above results in an increase in the extensions of the cracks 18 along the first surface 4, causing the cracks 18 to propagate along the first surface 4. In the present, embodiment, the increase of the volume of the medium 20 by the cooling process, resulting in crack propagation along the first surface 4, causes a complete division of the wafer 20. Specifically, the wafer 2 is divided along the division lines 14 into a plurality of dies 24, as is shown in FIG. 8. Thus, no additional step of dividing or separating the wafer 2 is required.

After the wafer 2 has been fully divided in this manner, the sheeting 15 may be radially expanded, e.g., by using an expansion drum (not shown), in order to increase the distance between adjacent dies 24. In this way, any damage to the dies 24 due to unintentionally touching or rubbing against each other can be reliably prevented. Subsequently, the dies 24 may be picked up from the sheeting IS for farther processing, transport or storage thereof.

In other embodiments, the strength of the wafer 2 in the areas thereof in which the cracks 18 are present, i.e., the areas along the division lines 14, may be reduced by increasing the volume of the medium 20 received in the cracks 18 without, however, fully dividing the wafer 2. In this case, a further step of dividing, i.e., fully dividing, the wafer 2 may be performed. This step may comprise or consist of applying an external force to the wafer 2. In particular, the external force may be applied to the wafer 2 by radially expanding the sheeting 15, so as to divide the wafer 2 into the separate dies 24.

In the method of the first embodiment, the application of the external stimulus to the liquid medium 20 consists of cooling the liquid medium 20. However, different types of external stimulus may be used, as has been detailed above. For example, applying the external stimulus to the liquid medium 20 may comprise or consist of heating the liquid medium 20 or comprise or consist of applying an electric field and/or a magnetic field to the liquid medium 20.

Figure 9:
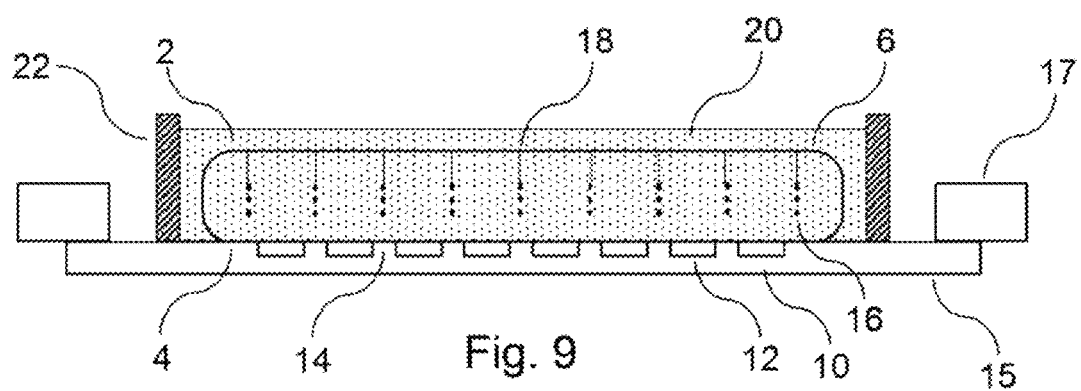
FIG. 9 is a cross-sectional view illustrating a step of immersing the wafer in a liquid medium in a method according to a further modification of the first embodiment.

A step of immersing the wafer 2 in the liquid medium 20 in a method according to a further modification of the first embodiment (see FIG. 6) is illustrated in FIG. 9. This step differs from the corresponding step of the method of the first embodiment (see FIG. 7) in that the cracks 18 in the wafer 2 extend from the modified regions 16 to the second surface 6, so that the liquid medium 20 is introduced into the cracks 18 via the second surface 6.

In the following, a second embodiment of the present invention will be described with reference to FIGS. 10 to 13.

Figure 10:
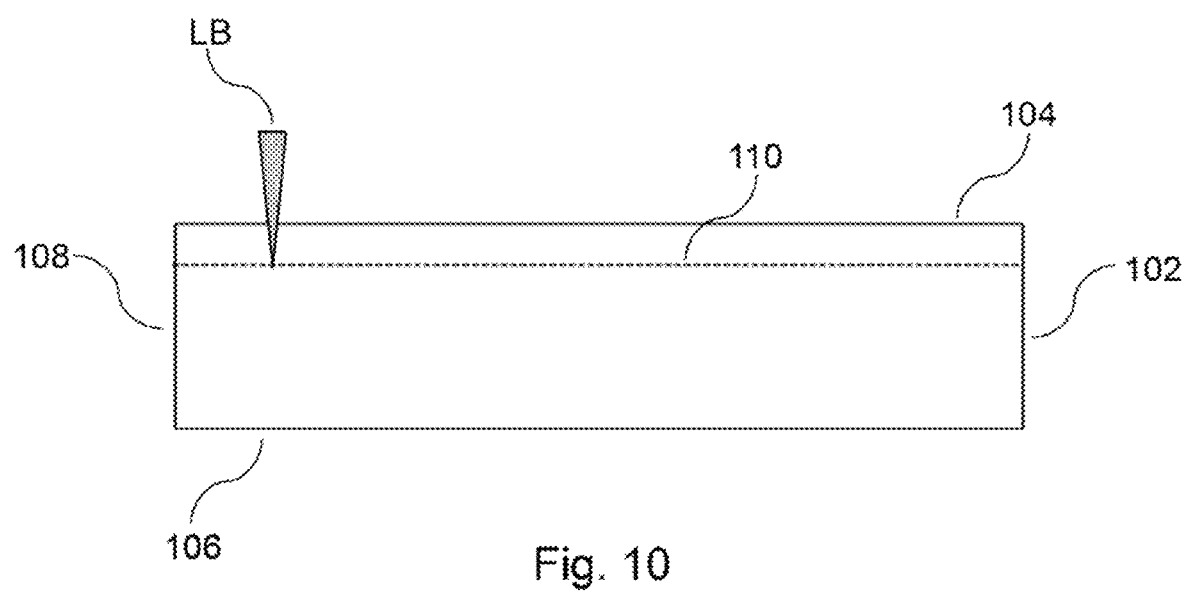
FIG. 10 is a cross-sectional view illustrating a step of applying a laser beam to an ingot as a workpiece, thereby forming modified regions inside the ingot, in a method according to a second embodiment of the present invention.
Figure 11:
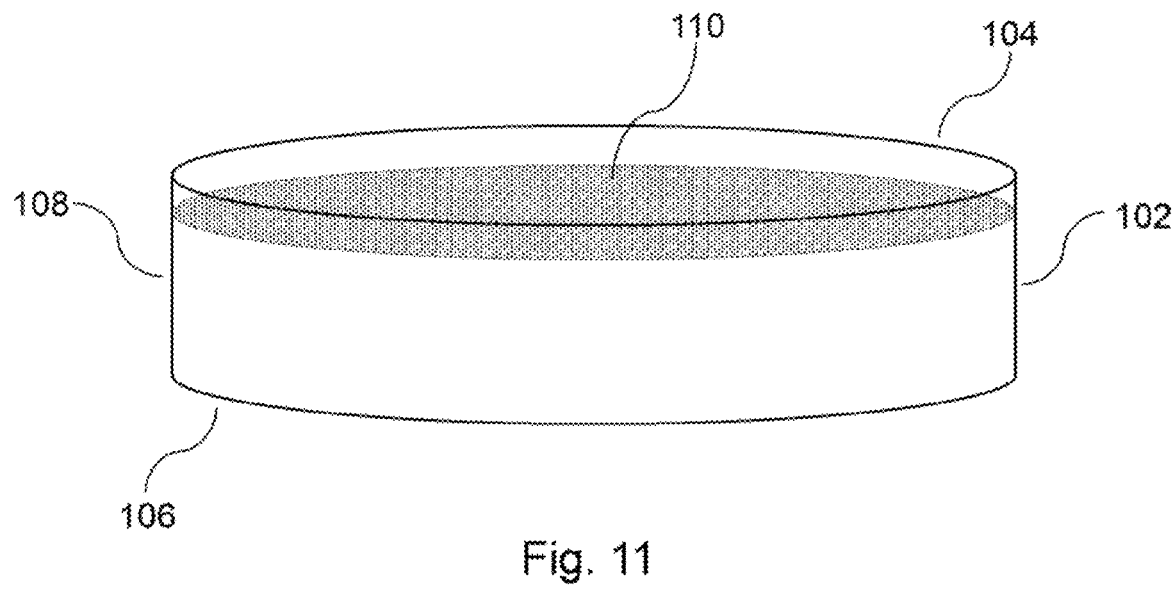
FIG. 11 is a perspective phantom view showing the ingot of FIG. 10 after formation of the modified regions.

In the second embodiment, the method of the invention is performed on an ingot 102 as a workpiece (see, for example, FIGS. 10 and 11). In particular, the ingot 102 may be a semiconductor ingot, such as a Si ingot or a SiC ingot. However, different types of workpiece and, in particular, different workpiece materials may be used, as has been detailed above.

As is shown in FIG. 10, the ingot 102 has a first surface 104, i.e., a front surface, and a second surface 106, i.e., a back surface, opposite the first surface 104. The first surface 104 and the second surface 106 are substantially parallel to each other. Further, the ingot 102 has a third surface 108, i.e., a side surface, extending between the first and second surfaces 104, 106 along the circumference of the ingot 102. In the present embodiment, no devices are formed on the first surface 104 of the ingot 102. However, in other embodiments, a device area with devices may be present on the first surface 104 of the ingot 102.

A pulsed laser beam LB is applied to the ingot 102 from the side of the first surface 104 of the ingot 102 (see FIG. 10). The pulsed laser beam LB may have a pulse width, for example, in the range of 1 fs to 1000 ns. The pulsed laser beam LB has a wavelength which allows transmission of the pulsed laser beam LB through the ingot 102. The pulsed laser beam LB is applied to the ingot 102 in a plurality of positions along the first surface 104 in a condition where a focal point of the pulsed laser beam LB is located at a distance from the first surface 104 in the direction from the first surface 104 towards the second surface 106, i.e., located inside the ingot 102 (see FIG. 10).

The pulsed laser beam LB is applied to the ingot 102 by a laser beam applying means (not shown) of a workpiece processing system (not shown) according to an embodiment of the present invention. In this embodiment, the laser beam applying means constitutes a modified region forming means of the system. The laser beam applying means may be the same as that, used for the method of the first embodiment. During the process of applying the pulsed laser beam LB to the ingot 102, the ingot 102 may be supported by a support member (not shown) of the workpiece processing system.

By applying the pulsed laser beam LB to the ingot 102 in this manner, a modified layer 110 is formed inside the ingot 102 (see FIGS. 10 and 11). The modified layer 110 consists of a plurality of modified regions (not shown). The modified layer 110 faces the first surface 104, i.e., the modified layer 110 is opposite the first surface 104 in the direction from the first surface 104 towards the second surface 106. The modified layer 110 is formed so as to be substantially parallel to the first surface 104.

The modified regions of the modified layer 110 are regions of the ingot 102 which have been modified by the application of the pulsed laser beam LB. In particular, the modified regions may be regions of the ingot 102 in which the structure of the ingot material has been modified by the application of the pulsed laser beam LB and/or the ingot 102 has been damaged by the application of the pulsed laser beam LB. The modified regions of the modified layer 110 may be substantially the same as the modified regions 16 formed in the method of the first embodiment. In particular, the modified regions of the modified layer 110 may be amorphous regions or regions in which cracks are formed.

As is shown in FIGS. 10 and 11, the modified layer 110 is formed substantially over an entire cross-section of the ingot 102, the cross-section being substantially perpendicular to the thickness direction of the ingot 102. The modified layer 110 is formed so as to be closer to the first surface 104 than to the second surface 106 in the thickness direction of the ingot 102.

Forming the modified layer 110 consisting of the modified regions in the ingot 102 induces stress in the ingot 102 in the area where the modified layer 110 is formed. This stress causes the creation of cracks (not shown) in the ingot 102 extending from the modified regions to the third surface 108. The cracks are examples of openings in the ingot 102 and are open to the third surface 108.

Figure 12:
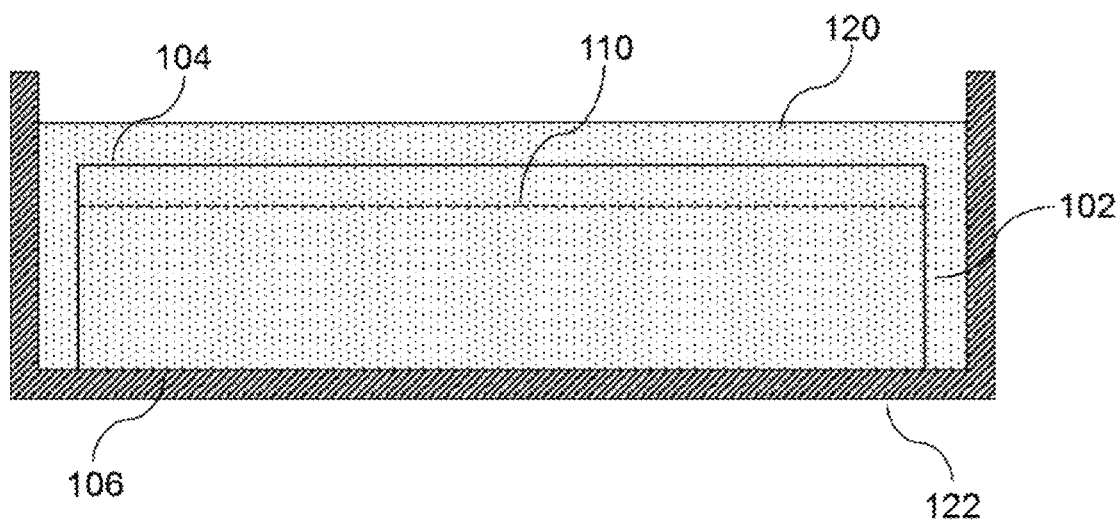
FIG. 12 is a cross-sectional view illustrating a step of immersing the ingot in a liquid medium in the method according to the second embodiment.

After forming the modified layer 110 consisting of the modified regions in the ingot 102, thus creating the cracks in the ingot 102, the ingot 102 is fully immersed in a liquid medium 120, as is shown in FIG. 12. Specifically, the liquid medium 120 is received in a container 122 and the ingot 102 is placed into the container 122.

The liquid medium 120 is supplied to the container 122 by a liquid medium supplying means (not shown) of the workpiece processing system (not shown). The liquid medium supplying means may comprise the container 122.

In the present embodiment, the liquid medium 120 is water, for example, deionized water. However, other types of liquid medium may be used, such as isopropanol or a liquid gas, e.g., liquid carbon dioxide ($CO_2$) or liquid nitrogen ($N_2$), as has been detailed above. In some embodiments, the liquid medium 120 may contain a surfactant. For example, the liquid medium 120 may contain or consist of water and a surfactant.

The liquid medium 120, in which the ingot 102 is immersed, is drawn into the cracks in the ingot 102 by capillary forces and thus introduced into these cracks.

In the method of the second embodiment, the ingot 102 is fully immersed in the liquid medium 120 in order to introduce the liquid medium 120 into the cracks. However, in other embodiments, the liquid medium 120 may be introduced into the cracks in a different way, as has been detailed above. For example, the liquid medium 120 may be sprayed or poured onto the third surface 108.

After immersing the ingot 102 in the liquid medium 120, thereby introducing the liquid medium 120 into the cracks, an external stimulus is applied to the liquid medium 120 so as to increase the volume of the medium 120 in the cracks. Specifically, the ingot 102 is removed from the immersion bath and the liquid medium 120 introduced in the cracks is cooled, by placing the ingot 102 in a freezer (not shown), so as to induce a phase transition of the medium 120 from the liquid phase to the solid phase. For example, the ingot 102 may be kept in the freezer for more than one hour. In some embodiments, the ingot 102 may be kept in the freezer for one hour or less. Thus, the liquid medium 120 is frozen by cooling the medium 120, i.e., the liquid medium 120 in the form of water is turned into ice. By inducing such a phase transition of the liquid medium 120, the volume of the medium 120 in the cracks is increased in a particularly efficient manner.

Alternatively, the combination of the ingot 102, the container 122 and the liquid medium 120 shown in FIG. 12 may be placed in the freezer, thereby cooling the liquid medium 120 introduced in the cracks, so as to induce a phase transition of the medium 120 from the liquid phase to the solid phase. For example, the combination may foe kept in the freezer for more than one hour. In some embodiments, the combination may be kept in the freezer for one hour or less.

After keeping the ingot 102 in the freezer, e.g., for a time of more than one hour, the ingot 102 is taken out of the freezer and defrosted. In particular, the ingot 102 may be heated so as to melt the ice generated by freezing the liquid medium 120. In some embodiments, the steps of freezing the liquid medium 120 and melting the frozen liquid medium 120 may be repeated one or more times, preferably two or more times. In this way, it can be particularly reliably ensured that the liquid medium 120 fully penetrates into the cracks.

Subsequently, the melted liquid medium 120 may be removed from the ingot 102.

The freezer is an example of a cooling means which is configured to cool the liquid medium 120. In the present embodiment, the freezer constitutes an external stimulus applying means of the workpiece processing system (not shown).

Figure 13:
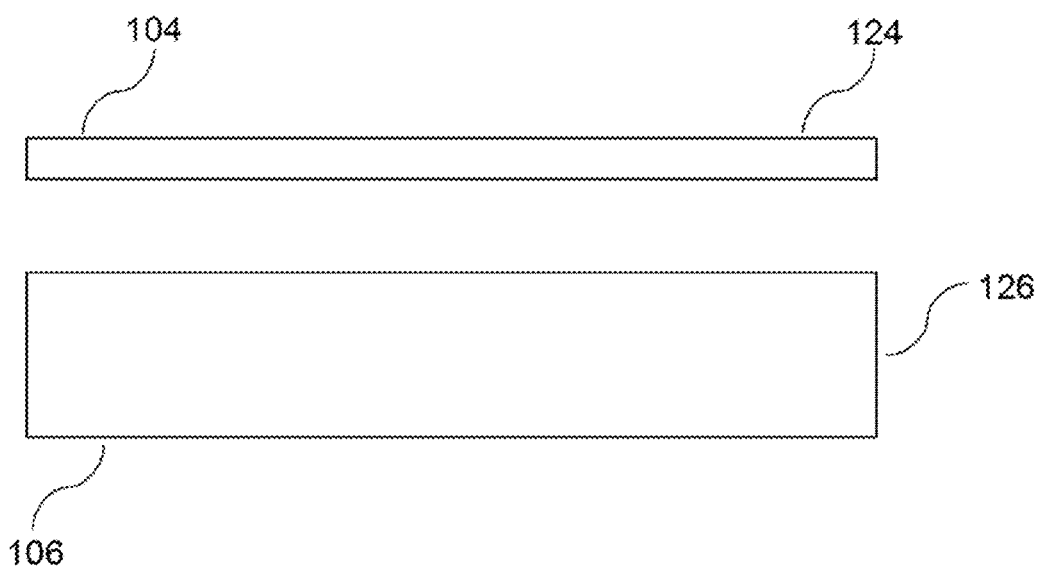
FIG. 13 is a cross-sectional view showing the outcome of a step of dividing the ingot in the method according to the second embodiment.

Increasing the volume of the medium 120 received in the cracks in the manner detailed above results in an increase in the extensions of the cracks along the third surface 108, causing the cracks to propagate along the third surface 108. In the present embodiment, the increase of the volume of the medium 120 by the cooling process, resulting in crack propagation along the third surface 108, causes a complete separation of the ingot 102 along the modified layer 110. By separating the ingot 102 in this manner, a substrate 124, such as a wafer, is obtained. Specifically, the substrate 124 is separated from a remainder 126 of the ingot 102, as is shown in FIG. 13. Thus, no additional step of dividing or separating the ingot 102 is required.

In other embodiments, the strength of the ingot 102 in the areas thereof in which the cracks are present may be reduced by increasing the volume of the medium 120 received in the cracks without, however, fully separating the ingot 102. In this case, a further step of separating, i.e., fully separating, the ingot 102 may be performed. This step may comprise or consist of applying an external force to the ingot 102.

In the method of the second embodiment, the application of the external stimulus to the liquid medium 120 consists of cooling the liquid medium 120. However, different types of external stimulus may be used, as has been detailed above. For example, applying the external stimulus to the liquid medium 120 may comprise or consist of heating the liquid medium 120 or comprise or consist of applying an electric field and/or a magnetic field to the liquid medium 120.

The invention claimed is:

1. A method of processing a workpiece having a first surface, a second surface opposite the first surface, and a third surface extending between the first and second surfaces, the method comprising:
    forming modified regions inside the workpiece so as to create openings in the workpiece, the openings extending from the modified regions through non-modified regions of the workpiece to at least one of the first surface, the second surface and the third surface, the modified regions being formed so as to be arranged entirely inside the workpiece, so that the modified regions do not extend to any one of the first surface, the second surface and the third surface;
    after forming the modified regions inside the workpiece, introducing a liquid medium into at least some of the openings, wherein the liquid medium is contained by a liquid barrier that surrounds the workpiece; and
    after introducing the liquid medium into the at least some of the openings, applying an external stimulus to the liquid medium so as to increase the volume of the medium, wherein the workpiece is divided by the step of applying the external stimulus to the liquid medium, without an additional dividing step, and
    wherein:
    the workpiece is supported by a sheeting; and
    the liquid barrier is provided on an upper surface of the sheeting.

2. The method according to claim 1, wherein forming the modified regions inside the workpiece comprises or consists of applying a laser beam to the workpiece.

3. The method according to claim 2, wherein the workpiece is made of a material which is transparent to the laser beam and the laser beam is applied to the workpiece in a condition where a focal point of the laser beam is located inside the workpiece or in a condition where the focal point of the laser beam is located on the first surface, on the second surface or on the third surface.

4. The method according to any one of the preceding claims, wherein applying the external stimulus to the liquid medium comprises or consists of heating the liquid medium or cooling the liquid medium.

5. The method according to claim 4, wherein applying the external stimulus to the liquid medium comprises or consists of applying an electric field and/or a magnetic field to the liquid medium.

6. The method according to claim 4, wherein applying the external stimulus to the liquid medium induces a phase transition of the liquid medium so as to increase the volume of the medium.

7. The method according to claim 4, wherein the openings are cracks in the workpiece.

8. The method according to claim 4, wherein the liquid medium is introduced into the at least some of the openings by applying the liquid medium or a vapour of the liquid medium to at least one of the first surface, the second surface and the third surface to which the openings extend so that at least a portion of the liquid medium at least partially enters into the openings.

9. The method according to claim 4, wherein the liquid medium is water.

10. The method according to claim 4, wherein the liquid medium contains a surfactant.

11. The method according to claim 1, wherein the sheeting comprises a tape.

12. The method according to claim 1, wherein the modified regions comprise or are amorphous regions.

13. The method according to claim 1, wherein the modified regions comprise or are regions in which cracks are formed.

14. A system for processing a workpiece having a first surface, a second surface opposite the first surface, and a third surface extending between the first and second surfaces, the system comprising:
- a modified region forming means configured to form modified regions inside the workpiece so as to create openings in the workpiece, the openings extending from the modified regions through non-modified regions of the workpiece to at least one of the first surface, the second surface and the third surface, the modified regions being formed so as to be arranged entirely inside the workpiece, so that the modified regions do not extend to any one of the first surface, the second surface and the third surface;
- a liquid medium supplying means configured to introduce a liquid medium into at least some of the openings, wherein the liquid medium is contained by a liquid barrier that surrounds the workpiece; and
- an external stimulus applying means configured to apply an external stimulus to the liquid medium introduced into the at least some of the openings so as to increase the volume of the medium,
- wherein the workpiece is divided when the external stimulus is applied to the liquid medium, without an additional dividing step, and
- wherein:
  - the workpiece is supported by a sheeting; and
  - the liquid barrier is provided on an upper surface of the sheeting.

15. The system according to claim 14, wherein the sheeting comprises a tape.

16. The system according to claim 14, wherein the modified regions comprise or are amorphous regions.

17. The system according to claim 14, wherein the modified regions comprise or are regions in which cracks are formed.

18. A method of processing a workpiece having a first surface, a second surface opposite the first surface, and a third surface extending between the first and second surfaces, the method comprising:
- forming a plurality of hole regions in the workpiece, wherein each hole region is composed of a modified region and an opening in the modified region, wherein the modified region surrounds the opening, wherein the opening extends to at least one of the first surface, the second surface and the third surface, and further wherein each modified region comprises or is an amorphous region;
- after forming the hole regions in the workpiece, introducing a liquid medium into at least some of the openings, wherein the liquid medium is contained by a liquid barrier that surrounds the workpiece; and
- after introducing the liquid medium into the at least some of the openings, applying an external stimulus to the liquid medium so as to increase the volume of the medium, and
- wherein:
- the workpiece is supported by a sheeting; and
- the liquid barrier is provided on an upper surface of the sheeting.

19. A system for processing a workpiece having a first surface, a second surface opposite the first surface, and a third surface extending between the first and second surfaces, the system comprising:
- a modified region forming means configured to form hole regions in the workpiece, wherein each hole region is composed of a modified region and an opening in the modified region, wherein the modified region surrounds the opening, wherein the opening extends to at least one of the first surface, the second surface and the third surface, and further wherein each modified region comprises or is an amorphous region;
- a liquid medium supplying means configured to introduce a liquid medium into at least some of the openings, wherein the liquid medium is contained by a liquid barrier that surrounds the workpiece; and
- an external stimulus applying means configured to apply an external stimulus to the liquid medium introduced into the at least some of the openings so as to increase the volume of the medium, and
- wherein:
- the workpiece is supported by a sheeting; and
- the liquid barrier is provided on an upper surface of the sheeting.

* * * * *